(12) United States Patent
Forrest et al.

(10) Patent No.: US 8,013,240 B2
(45) Date of Patent: *Sep. 6, 2011

(54) ORGANIC PHOTOVOLTAIC CELLS UTILIZING ULTRATHIN SENSITIZING LAYER

(75) Inventors: Stephen R. Forrest, Ann Arbor, MI (US); Fan Yang, Piscataway, NJ (US); Barry P. Rand, Somers, NY (US)

(73) Assignee: The Trustees of Princeton University, Princeton, NJ (US)

( * ) Notice: Subject to any disclaimer, the term of this patent is extended or adjusted under 35 U.S.C. 154(b) by 1282 days.

This patent is subject to a terminal disclaimer.

(21) Appl. No.: 11/566,134

(22) Filed: Dec. 1, 2006

(65) Prior Publication Data

US 2007/0215868 A1   Sep. 20, 2007

Related U.S. Application Data

(63) Continuation-in-part of application No. 11/263,865, filed on Nov. 2, 2005.

(51) Int. Cl.
*H01L 31/00* (2006.01)

(52) U.S. Cl. ........................................ 136/263; 136/252

(58) Field of Classification Search .................... 136/263
See application file for complete search history.

(56) References Cited

U.S. PATENT DOCUMENTS

| | | | |
|---|---|---|---|
| 4,999,267 A * | 3/1991 | Sakamoto | ................... 430/59.1 |
| 5,201,961 A | 4/1993 | Yoshikawa et al. | |
| 5,350,459 A | 9/1994 | Suzuki et al. | |
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,420,430 B1 | 7/2002 | Linz et al. | |
| 6,440,769 B2 | 8/2002 | Peumans et al. | |
| 6,451,415 B1 | 9/2002 | Forrest et al. | |
| 6,580,027 B2 | 6/2003 | Forrest et al. | |
| 6,657,378 B2 | 12/2003 | Forrest et al. | |
| 2003/0042846 A1 | 3/2003 | Forrest et al. | |
| 2003/0088043 A1* | 5/2003 | Huang et al. | ................... 528/25 |
| 2003/0127967 A1 | 7/2003 | Tsutsui et al. | |

(Continued)

FOREIGN PATENT DOCUMENTS

JP        2001-267077 A1    9/2001

(Continued)

OTHER PUBLICATIONS

Yang, Loos, Veenstra, Verhees, Wienk, Kroon, Michels and Janssen. Nanoscale morphology of high performance polymer solar cells, Mar. 2, 2005, Nano Letters, 5, 4, 579-583.*

(Continued)

*Primary Examiner* — Alexa D Neckel
*Assistant Examiner* — Miriam Berdichevsky
(74) *Attorney, Agent, or Firm* — Duane Morris LLP

(57) ABSTRACT

A photosensitive device includes a plurality of organic photoconductive materials disposed in a stack between a first electrode and a second electrode, including a first continuous layer of donor host material, a second continuous layer of acceptor host material, and at least one other organic photoconductive material disposed as a plurality of discontinuous islands between the first continuous layer and the second continuous layer. Each of these other photoconductive materials has an absorption spectra different from the donor host material and the acceptor host material. Preferably, each of the discontinuous islands consists essentially of a crystallite of the respective organic photoconductive material, and more preferably, the crystallites are nanocrystals.

31 Claims, 10 Drawing Sheets

U.S. PATENT DOCUMENTS

| | | | |
|---|---|---|---|
| 2005/0110007 | A1 | 5/2005 | Forrest et al. |
| 2005/0224113 | A1 | 10/2005 | Xue et al. |
| 2005/0266218 | A1 | 12/2005 | Peumans et al. |
| 2006/0027802 | A1 | 2/2006 | Forrest et al. |
| 2006/0032529 | A1 | 2/2006 | Rand et al. |
| 2007/0096085 | A1 | 5/2007 | Rand et al. |

FOREIGN PATENT DOCUMENTS

| | | |
|---|---|---|
| WO | 2005/101524 A2 | 10/2005 |

OTHER PUBLICATIONS

Peumans et al., "Efficient photon harvesting at high optical intensities in ultrathin organic double-heterostructure photovoltaic diodes," Appl. Phys. Letts. 76: 2650-52, 2000.

Miessler and Tarr, "Inorganic Chemistry" ($2^{nd}$ Edition), Prentice Hall, 1999, pp. iii (contents), 1-3, 422-424, and 442.

Forrest, "The path to ubiquitous and low-cost organic electronic appliances on plastic," Nature 428: 911-918, 2004.

Forrest, "The limits to organic photovoltaic cell efficiency," MRS Bullentin 30(1): 28-32, 2005.

Xue et al., "Asymmetric tandem organic photovoltaic cells with hybrid planar-mixed molecular heterojunctions," Appl. Phys. Letts. 85(23): 5757-5759, 2004.

Wang et al., "Infrared photocurrent spectral response from plastic solar cell with low-band-gap polyfluorene and fullerene derivative", Appl. Phys. Letts. 85(21): 5081-5083, 2004.

Xue et al., "4.2% efficient organic photovoltaic cells with low series resistances", Appl. Phys. Letts. 84(16): 3013-3015, 2004.

Xue et al., "Carrier transport in multilayer organic photodetectors: II. Effects of anode preparation", J. Appl. Phys. 95(4):1869-1877, 2004.

Laudise et al., "Physical vapor growth of organic semiconductors", J. Crystal Growth 187: 449-454, 1998.

Pettersson et al., "Modeling photocurrent action spectra of photovoltaic devices based on organic thin films", J. Appl. Phys. 86(1): 487-496, 1999.

Friedel et al., "A new metal (II) phthalocyanine structure: X-ray and Mössbauer studies of the triclinic tin (II) phthalocyanine", Chemical Communications, 400-401, 1970.

Kubiak et al., "X-ray analysis of phthalocyanines formed in the reaction of Au-Cu and Au-Sn alloys with 1,2-dicyanobenzene", J. Alloys and Compounds 189: 107-111, 1992.

Walzer et al., "STM and STS investigation of ultrathin tin phthalocyanine layers adsorbed on HOPG(0001) and Au(111)", Surf. Sci. 471: 1-10, 2001.

Chen et al., Investigation on structure, spectrum and linear dichroism of SnPc polycrystalline films, Acta Phys. Sin. 45(1): 146-152, 1996.

Pope et al., "Electronic processes in organic crystals and polymers" ($2^{nd}$ Edition), Oxford University Press, New York, 1999 (abstract included only).

Rand et al., "Mixed donor-acceptor molecular heterojunctions for photovoltaic applications. I. material properties", J. Appl. Phys. 98: 124902-1 to 124902-7 (2005).

Brown et al., "Crystal structure of β-copper phthalocyanine", J. Chem. Soc. A, 2488-2493 (1968).

Rand et al., "Long-range absorption enhancement in organic tandem thin-film solar cells containing silver nanoclusters", J. Appl. Phys. 96(12): 7519-7526, 2004.

International Search Report PCT/US2007/024651, date of filing Nov. 29, 2007, date of mailing Feb. 22, 2008.

Maennig B et al, Organic P-I-N solar cells, Applied Physics A: Materials Science and Processing, Springer Verlag, Berlin, DE, vol. A79, No. 1, Mar. 5, 2004, pp. 1-14.

Peumans Peter et al: Small molecular weight organic thin-film photodetectors and solar cells, Journal of Applied Physics, American Journal of Applied Physics, American Institute of Physics, New York, US, vol. 93, No. 7, Apr. 1, 2003, pp. 3693-3723.

Luque, A. and Hegedus, S., Handbook of Photovoltaic Science and Engineering, 2003, John Wiley & Sons Ltd, 363-365.

U.S. Appl. No. 10/915,410, in the name of Rand et al., "Organic Photosensitive Devices," filed Aug. 1, 2004.

U.S. Appl. No. 10/979,145 in the name of Forrest et al. "Stacked Organic Photosensitve Devices," filed Nov. 3, 2004.

U.S. Appl. No. 10/857,747 in the name of Peumans et al., "Aperiodic Dielectric Multilayer Stack," filed Jun. 1, 2004.

Suemori et al., "Organic solar cells protected by very thick naphthalene tetracarboxylic anhydride films," Appl. Phys. Lett. 86(25): pp. 6269-6271, 2004.

International Search Report, PCT Application No. PCT/US2006/041990 filedOct. 26, 2006.

S. Uchida, J. Xue, B. Rand and S. Forrest, Organic small molecule solar cell with homogeneously mixed copper phthalocyanine: C60 active layer, May 24, 2004, Applied Physics Letters, 84 (21) 4218-4220.

International Search Report, PCT Application No. PCTUS2005/012928 filed Apr. 13, 2005.

Office Action issued for Chinese Patent Application No. 200780049808.7 dated Dec. 6, 2010, National Phase Application of U.S. Appl. No. 11/566,134, filed Dec. 6, 2010.

* cited by examiner

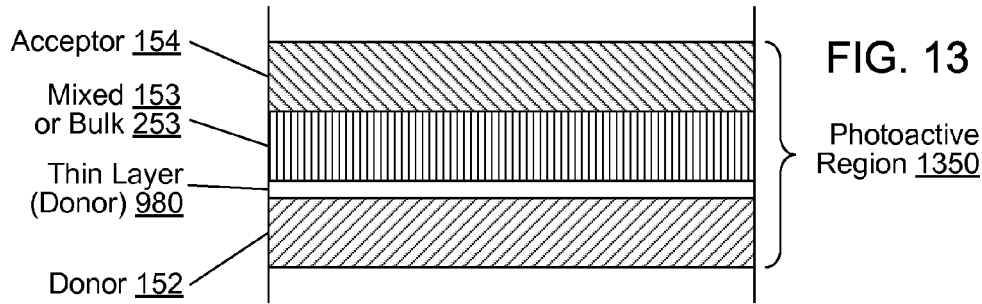
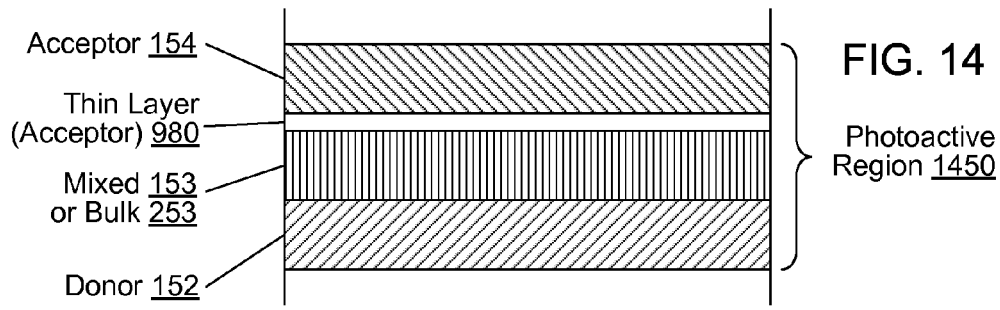
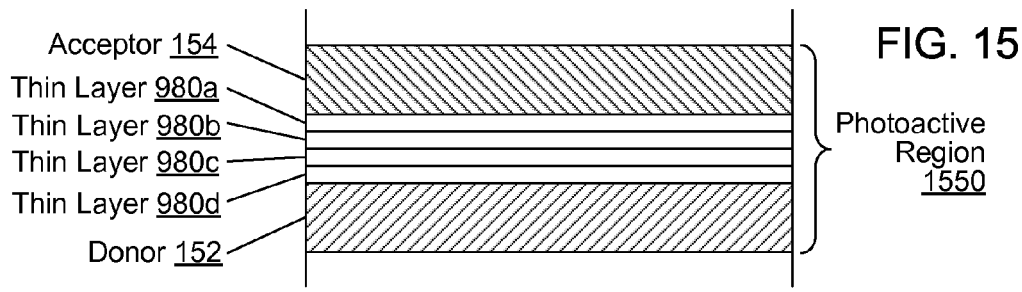
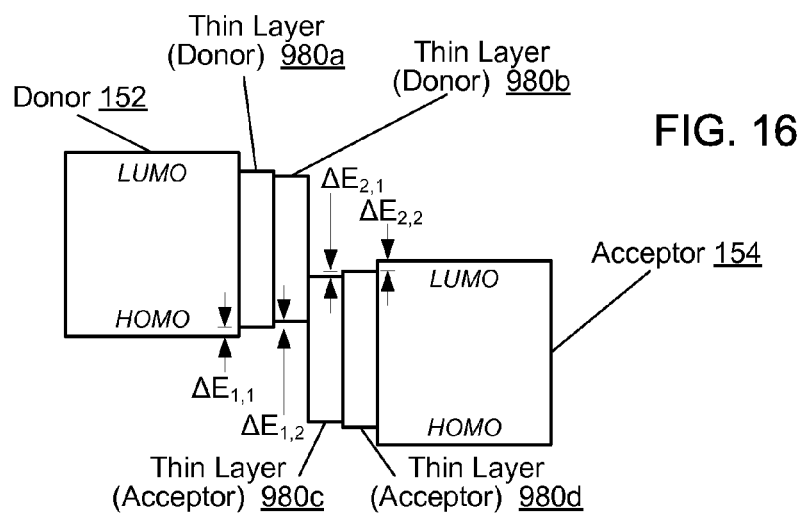

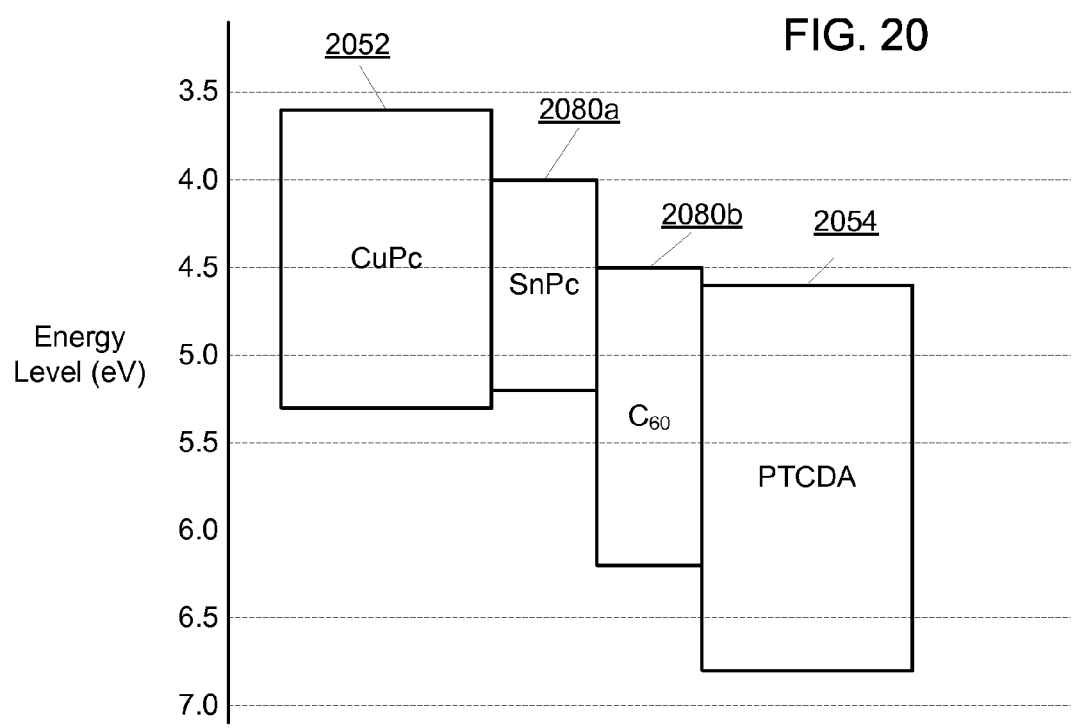

ORGANIC PHOTOVOLTAIC CELLS UTILIZING ULTRATHIN SENSITIZING LAYER

RELATED APPLICATIONS

This application is a continuation-in-part of U.S. application Ser. No. 11/263,865 filed Nov. 2, 2005 (pending), the contents of which are incorporated herein by reference.

JOINT RESEARCH AGREEMENT

Portions of the claimed invention were made by, on behalf of, and/or in connection with one or more of the following parties to a joint university-corporation research agreement Princeton University, The University of Southern California, and Global Photonic Energy Corporation. The remainder of the claimed invention was made by, on behalf of, and/or in connection with one or more of the following parties to a joint university-corporation research agreement The University of Michigan, The University of Southern California, and Global Photonic Energy Corporation. The agreements were in effect on and before the date the respective portions of the claimed invention were made, and the claimed invention was made as a result of activities undertaken within the scope of the agreements.

UNITED STATES GOVERNMENT RIGHTS

This invention was made with U.S. Government support under Contract Grant No. 339 1012 DE-AC36-98-GO10337 and sub-contract XAT 5-33636-03 awarded by U.S. Department of Energy, National Renewable Energy Laboratory. The government has certain rights in this invention.

FIELD OF THE INVENTION

The present invention generally relates to organic photosensitive optoelectronic devices. More specifically, it is directed to organic photosensitive optoelectronic devices including an ultra-thin low mobility active layer that is responsive to near infrared.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the excited molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 dissociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

One common feature of bulk semiconductors, as well as insulators, is a "band gap." The band gap is the energy difference between the highest energy level filled with electrons and the lowest energy level that is empty. In an inorganic semiconductor or inorganic insulator, this energy difference is the difference between the valence band edge (top of the valence band) and the conduction band edge (bottom of the conduction band). In an organic semiconductor or organic insulator, this energy difference is the difference between the HOMO and the LUMO. The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band model for organic semiconductors, only electrons on the LUMO side of the band gap are charge carriers, and only holes on the HOMO side of the band gap are charge carriers.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

A photosensitive device includes a plurality of organic photoconductive materials disposed in a stack between a first electrode and a second electrode, including a first continuous layer of donor host material, a second continuous layer of acceptor host material, and at least one other organic photoconductive material disposed as a plurality of discontinuous islands between the first continuous layer and the second continuous layer. Each of these other photoconductive materials has an absorption spectra different from the donor host material and the acceptor host material.

Preferably, each of the discontinuous islands consists essentially of a crystallite of the respective organic photoconductive material. The crystallites are preferably nanocrystals, each of the discontinuous islands having no dimension greater than 100 nm. More preferably, a distance from any point within each of the islands to a boundary of the island is not more than one exciton diffusion length of the respective organic photoconductive material for a majority of the islands of each organic photoconductive material.

The first continuous layer may be in direct contact with the second continuous layer in-between the islands of the other organic photoconductive materials.

At least one of the other organic photoconductive materials is preferably a small molecule. Likewise, the donor host material and the acceptor host material are preferably small molecules.

As an example of an organic photoconductive material arranged as a sensitizer, a band gap of at least one of the other organic photoconductive materials is less in magnitude (i.e., the absolute value of the difference between HOMO and LUMO) than a band gap of the donor host material and less than a band gap of the acceptor host material. As another example of an organic photoconductive material arranged as a sensitizer, a band gap of at least one of the other organic photoconductive materials is greater in magnitude than a band gap of the donor host material and greater than a band gap of the acceptor host material. As yet another example of an organic photoconductive material arranged as a sensitizer, a band gap of at least one of the other organic photoconductive materials is in between (in magnitude) a band gap of the donor host material and a band gap of the acceptor host material. If plural sensitizers are included, sensitizers having band gaps reflecting each of these examples can be included in a same photoactive region.

As an example, at least one organic photoconductive material of the other organic photoconductive materials may have a hole mobility of less than $1\times10^{-9}$ cm$^2$/Vs and an absorption coefficient of at least $5\times10^4$ cm$^{-1}$ across a wavelength band from 600 nm to 900 nm.

Preferred example sensitizer materials include tin (II) phthalocyanine (SnPc) and lead phthalocyanine (PbPc). With such sensitizers, a preferred acceptor host material is $C_{60}$.

At least one sensitizer preferably has an absorption coefficient of at least $5\times10^4$ cm$^{-1}$ across a wavelength band from 600 nm to 900 nm.

The device may include a reflective surface. At least a portion of the islands of a sensitizer having an absorption coefficient of at least $5\times10^4$ cm'across a wavelength band from 600 nm to 900 nm are disposed at an optical path length of $\lambda_1 \cdot d + \lambda_1/4$ from the reflective surface of the device, where $\lambda_1$ is a wavelength in the wavelength band from 600 nm to 900 nm, d is an integer $\geq 0$, and the reflective surface is reflective to at least 50% of incident light at $\lambda_1$. The reflective surface may be provided, for example, by one of the first electrode, the second electrode, and a reflector.

The device may be arranged in a tandem structure including plural photoactive regions. For example, the plurality of organic photoconductive materials may be part of a first cell in a stack of photoactive cells disposed between the first electrode and the second electrode. The tandem device further includes at least a second cell of the stack of photoactive cells, the second cell comprising at least one donor-acceptor heterojunction. Preferably, the first cell and the second cell have different absorption characteristics, an average absorption of the first cell is greater than the average absorption of the second cell over a range of wavelengths $\lambda_1 \pm 5\%$, and an average absorption of the second cell is greater than the average absorption of the first cell over a range of wavelengths $\lambda_2 \pm 5\%$, where $\lambda_1 \geq \lambda_2 + 10\%$.

The plurality of discontinuous islands may include islands of multiple different sensitizers. Preferably, no more than 11 different sensitizers are included in a single photoactive region. For example, in one photoactive region, there may be islands of a first sensitizer of the other photoconductive materials and islands of a second sensitizer of the other photoconductive materials, with the first sensitizer having an absorption spectra different from the second sensitizer. The preferred limit of no more than 11 sensitizers applies to a single photoactive region, and in a tandem arrangement, each photoactive region preferably includes at least some different sensitizers. For example, two photoactive regions might include two completely separate or partially overlapping sets (in terms of materials selected) of sensitizers, each set including no more than 11 sensitizers in number.

If multiple sensitizers are included in a photoactive region, a distance from any point within each island of a first sensitizer to a boundary of the island is preferably not more than one exciton diffusion length of the sensitizer material (i.e., the respective organic photoconductive material) for a majority of the islands of the first sensitizer, and a distance from any point within each island of the second sensitizer to a boundary of the island is not more than one exciton diffusion length of the second sensitizer for a majority of the islands of the second sensitizer.

A method of fabricating a photosensitive optoelectronic device includes depositing a first organic photoconductive material over a first electrode to form a first continuous layer, depositing a second organic photoconductive material over the first continuous layer to form a first discontinuous layer comprising a plurality of islands, depositing a third organic photoconductive material over the first discontinuous layer to form a second continuous layer, and depositing a second electrode over the second continuous layer. One of the first organic photoconductive material and the second organic photoconductive material consists essentially of a donor host material, and an other of the first organic photoconductive material and the second organic photoconductive material consists essentially of an acceptor host material. The second organic photoconductive material is a sensitizer having an absorption spectra different from the donor host material and the acceptor host material.

Preferably, each island consists essentially of a crystallite of the second organic photoconductive material. The crystallites are preferably nanocrystals, such that during the deposition of the second organic photoconductive material, each area of material growth contributes no more than 100 nm of growth in any dimension. More preferably, a distance from any point within each of the islands to a boundary of the island is not more than one exciton diffusion length of the second organic photoconductive material for a majority of the islands of the second organic photoconductive material.

A thickness of the first discontinuous layer is preferably not greater than 200 Å. More preferably, a thickness of the first discontinuous layer is not greater than 100 Å.

Other discontinuous layers may also be deposited. For example, the method may further include depositing a fourth organic photoconductive material, after depositing the first discontinuous layer but before depositing the second continuous layer, to form a second discontinuous layer comprising a plurality of islands, each island consisting essentially of a crystallite of the fourth organic photoconductive material. The fourth organic photoconductive material is a sensitizer having an absorption spectra different from the donor host material, the acceptor host material, and the second organic photoconductive material. During the depositing of the fourth organic photoconductive material, each area of material growth preferably contributes no more than 100 nm of growth in any dimension.

Preferably at least one (or all) of the sensitizers, as well as the donor and the acceptor, are small molecule materials. For example, the first, second, third, and fourth organic photoconductive materials may be small molecule materials.

The method may further include sequentially depositing additional organic photoconductive materials, after depositing the fourth organic photoconductive material but before depositing the second continuous layer, to form additional discontinuous layers comprising islands. Preferably, each island consists essentially of a crystallite of the respective organic photoconductive material, and during the depositing of each additional organic photoconductive material, each area of material growth contributes no more than 100 nm of growth in any dimension. Each additional organic photoconductive material is a sensitizer having an absorption spectra different from the donor host material, the acceptor host material, and the other sensitizers (including the second and fourth organic photoconductive materials in the example above). Preferably, not more than 11 different sensitizers are deposited between the first continuous layer and the second continuous layer (i.e., not more than 11 different sensitizers are deposited in a single photoactive region).

As noted in the discussion of the finished device above, an example of an organic photoconductive material arranged as a sensitizer is if the second organic photoconductive material has a band gap that is less than a band gap of the donor host material and less than a band gap of the acceptor host material. As another example, the second organic photoconductive material may have a band gap that is greater than a band gap of the donor host material and greater than a band gap of the acceptor host material. As yet another example, the second organic photoconductive material may have a band gap in between a band gap of the donor host material and a band gap of the acceptor host material. If plural sensitizers are deposited, sensitizers having band gaps reflecting each of these examples can be deposited into what will be come a same photoactive region.

BRIEF DESCRIPTION OF THE DRAWINGS

FIG. 13 illustrates a hybrid heterojunction including the thin photoactive layer as a donor.

FIG. 14 illustrates a hybrid heterojunction including the thin photoactive layer as an acceptor.

FIG. 15 illustrates a planar heterojunction including a plurality of thin photoactive layers.

FIG. 16 illustrates an energy level diagram including the plurality of thin photoactive layers for the planar heterojunction in FIG. 15.

FIG. 20 illustrates an energy level diagram for an example arrangement of four photoconductive materials.

The device structure figures are not necessarily drawn to scale.

DETAILED DESCRIPTION

Figure 1:
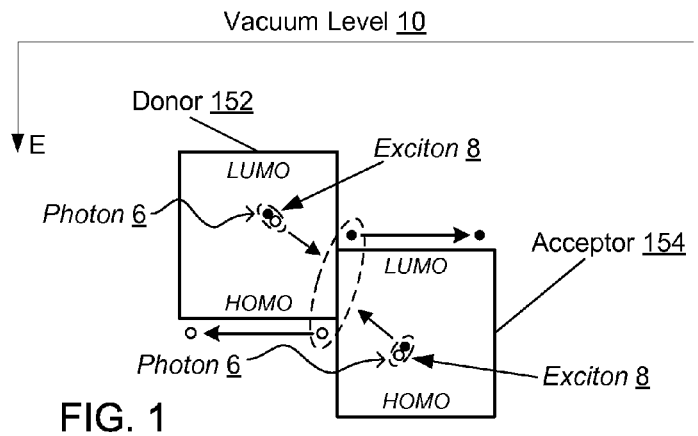
FIG. 1 is an energy level diagram illustrating a donor-acceptor heterojunction.
Figure 2:
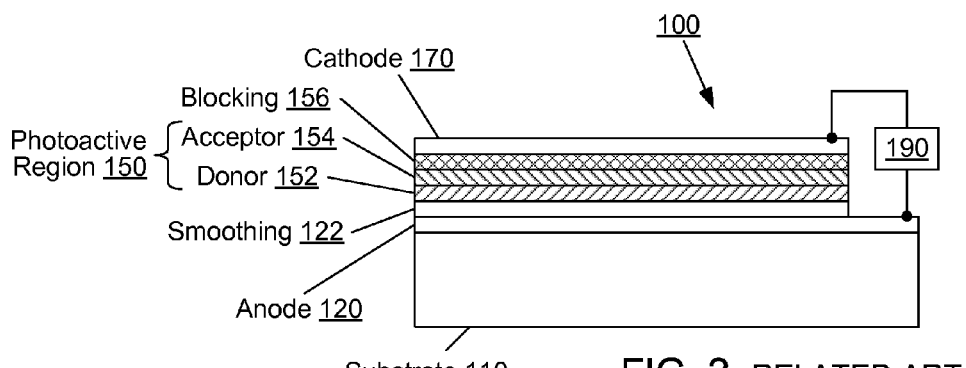
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference for its disclosure related to EBLs. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs (among other things) reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, organic vapor jet deposition, inkjet printing and other methods known in the art.

Figure 3:
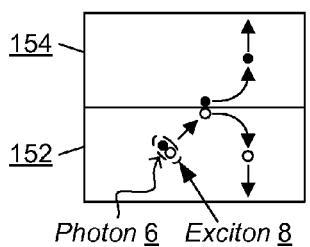
FIG. 3 illustrates a donor-acceptor bilayer forming a planar heterojunction.
Figure 4:
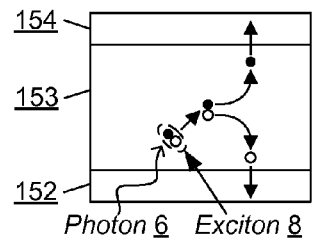
FIG. 4 illustrates a hybrid heterojunction including a mixed heterojunction between a donor layer and an acceptor layer.
Figure 5:
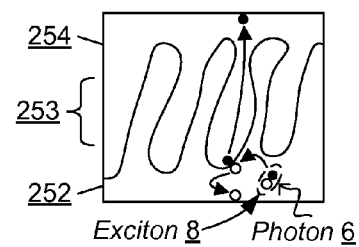
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials arranged between the donor material 152 and the acceptor material 154. FIG. 5 illustrates an idealized "bulk" heterojunction. A bulk heterojunction 253, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, U.S. Published Patent Application 2005-0224113 A1 entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
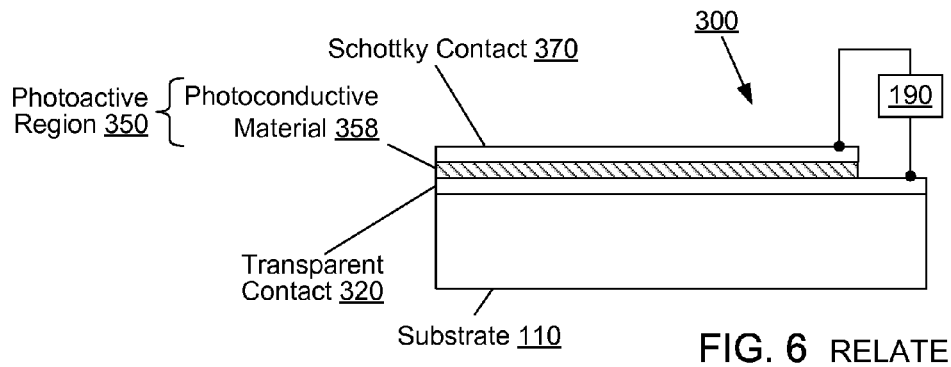
FIG. 6 illustrates an organic photosensitive device including a Schottky-barrier heterojunction.

FIG. 6 shows an example of a organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the dissociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application Publication 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004 (now Published U.S. Patent Application Publication 2006-0032529 A1); and U.S. patent application Ser. No. 10/979,145 entitled "Stacked Organic Photosensitive Devices" by Forrest et al., filed Nov. 3, 2004 (now Published U.S. Patent Application Publication 2006-0027802 A1); each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
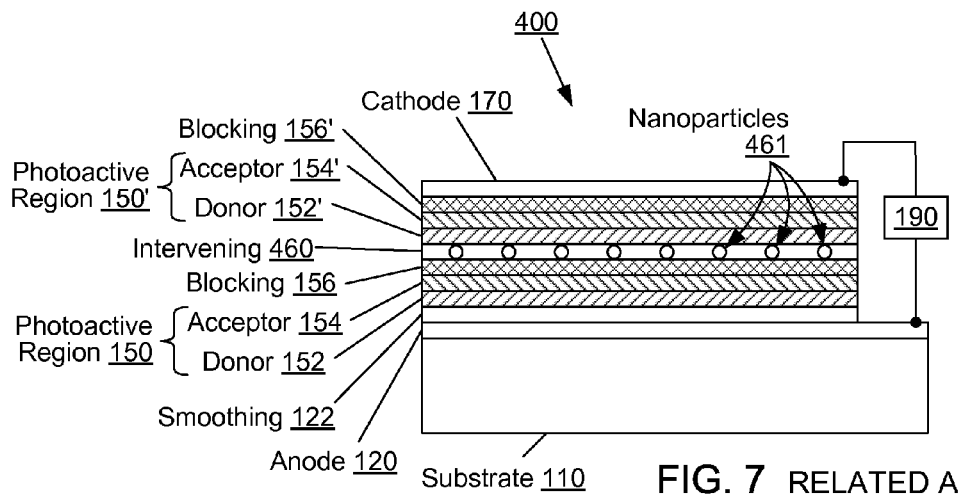
FIG. 7 illustrates tandem photosensitive cells in series.
Figure 8:
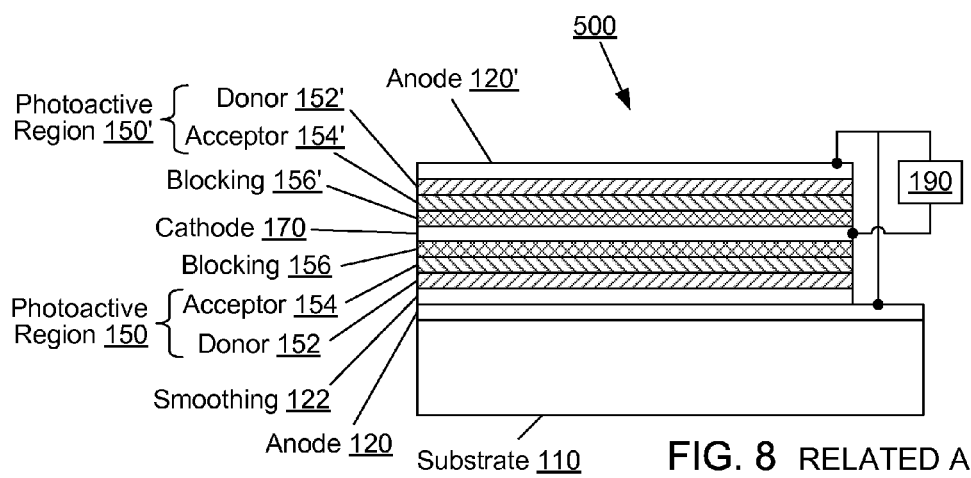
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in U.S. patent application Ser. No. 10/857,747 entitled "Aperiodic dielectric multilayer stack" by Peumans et al., filed Jun. 1, 2004 (now Published U.S. Patent Application Publication US 2005-0266218 A1), which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

Photovoltaic devices produce a photo-generated current when they are connected across a load and are irradiated by light. When irradiated under infinite load, a photovoltaic device generates its maximum possible voltage, V open-circuit, or $V_{OC}$. When irradiated with its electrical contacts shorted, a photovoltaic device generates its maximum possible current, I short-circuit, or $I_{SC}$. When actually used to generate power, a photovoltaic device is connected to a finite resistive load and the power output is given by the product of the current and voltage, I×V. The maximum total power generated by a photovoltaic device is inherently incapable of exceeding the product, $I_{SC} \times V_{OC}$. When the load value is optimized for maximum power extraction, the current and voltage have the values, $I_{max}$ and $V_{max}$, respectively.

A figure of merit for photovoltaic devices is the fill factor, ff, defined as:

$$ff = \{I_{max} V_{max}\} / \{I_{SC} V_{OC}\}$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, p, may be calculated by:

$$P = ff * (I_{SC} * V_{OC}) / P_{inc}$$

Organic photovoltaic cells have many potential advantages when compared to traditional silicon-based devices. Organic photovoltaic cells are light weight, economical in materials use, and can be deposited on low cost substrates, such as flexible plastic foils. However, some organic photovoltaic devices typically have relatively low external quantum efficiency, being on the order of 1% or less. This is, in part, thought to be due to the second order nature of the intrinsic photoconductive process. That is, carrier generation requires exciton generation, diffusion and ionization or collection. There is an efficiency associated with each of these processes. Subscripts may be used as follows: P for power efficiency, EQE for external quantum efficiency, A for photon absorption, ED for exciton diffusion, CC for charge collection, and INT for internal quantum efficiency. Using this notation:

$$\eta_P \sim \eta_{EQE} = \eta_A * \eta_{ED} * \eta_{CC}$$

$$\eta_{EQE} = \eta_A * \eta_{INT}$$

Photodetectors and photovoltaic (PV) cells using small molecular weight organic thin films deposited on plastic substrates have the potential advantages of being low-cost and lightweight. See S. R. Forrest, "The path to ubiquitous and low-cost organic electronic appliances on plastic," Nature 428, 911-918 (2004). Recently, the power conversion efficiency of molecular organic PV cells has steadily improved due to the use of new materials and device architectures. See S. R. Forrest, "The Limits to Organic Photovoltaic Cell Efficiency," MRS Bulletin 30, 28-32 (2005); and J. Xue et al., "Asymmetric tandem organic photovoltaic cells with hybrid planar-mixed molecular heterojunctions," Applied Physics Letters 85, 5757-5759 (2004).

One problem with organic PV energy conversion, however, is the limited overlap between the active layer absorption with the solar spectrum. Indeed, over 60% of the total solar photon flux is at wavelengths λ>600 nm with approximately 50% in the red and near infrared (NIR) spectrum at 600<λ<1000 nm. Therefore, new materials need to be developed that can absorb NIR radiation, and efficiently convert absorbed photons into current.

Recently, a polymer-based solar cell sensitive to NIR radiation up to λ=1000 nm achieved a power conversion efficiency of 0.3% under 1 sun illumination. See X. J. Wang et al., Applied Physics Letters 85, 5081 (2004). However, previous efforts with small molecule materials have failed to extend device responsivity into NIR.

Research into developing a small molecule photosensitive device has yielded a new architecture which, in addition to achieving NIR responsivity, may be used to tune and/or broaden the sensitivity of any donor-acceptor heterojunction. By incorporating a thin sensitizing layer between donor and acceptor, this new architecture enables the construction of photosensitive devices which retain their overall device thickness, but which can produce photocurrent in a part of the spectrum otherwise inaccessible using other materials.

In addition, a larger array of different materials are available for use as the thin sensitizing layer than would otherwise be viable as either a conventional donor or acceptor layer. For example, a material having low charge carrier mobility can be employed without a loss of device performance. By pairing the thin sensitizing layer with an energetically favorable donor or acceptor layer, the thin sensitizing layer contributes to photocurrent, without impeding carrier transport between the donor and acceptor.

Figure 9:
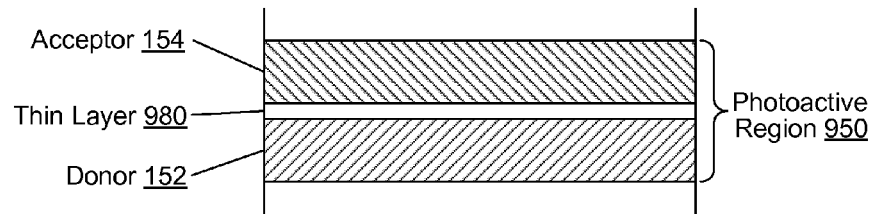
FIG. 9 illustrates a planar heterojunction modified to include an additional thin photoactive layer.

FIG. 9 illustrates a donor-acceptor heterojunction, as used in the devices (e.g., 100, 400, 500) discussed above, modified to incorporate the new thin sensitizing layer 980 within a photoactive region 950. The thin sensitizing layer 980 comprises a host material that is different from either that of the donor 152 or the acceptor 154. A "host material" of an organic photoactive layer, as defined herein, is a photoactive organic molecule making up more than 50% molar of the respective layer. The thin sensitizing layer 980 may be configured as a donor or as an acceptor. In any case, a distance from any point within the host material of the sensitizing layer 980 to a boundary of that layer is preferably not more than one exciton diffusion length over a majority (>50%) of the area of the thin sensitizing layer 980. An exciton diffusion length is the travel distance over which 1/e excitons decay/recombine. The distance is over a "majority" of the area since the layer 980 may include edge effects and small variations in local thickness (e.g., bumps and beads). Preferably, edge effects and the like are avoided, and the distance from any point within the host material of the thin sensitizing layer 980 to a boundary of that layer is not more than one exciton diffusion length over an entirety of the area of the thin sensitizing layer 980. Preferably, even if twice this distance across the sensitizing layer 980 is more than 200 Å, the layer thickness is no greater than 200 Å. More preferably, the layer thickness is no greater than 100 Å.

Due to efficiency concerns, a balance may be struck between the thinness and the photocurrent contribution of the sensitizing layer 980. Favoring a thin layer is the desire to minimize resistivity across the photoactive layer for carriers transiting between donor layer 152 and acceptor layer 154, and maximizing the ability of excitons formed in the sensitizing layer 980 to reach a rectifying interface. Favoring a thick layer is the volume in which photons can be absorbed in the absorption wavelength band of the sensitizing layer 980. While two exciton diffusion lengths is an idealized thickness upper limit, it is expected that for most material combinations and light-source spectra, a thinner sensitizing layer 980 is desirable.

Figure 10A:
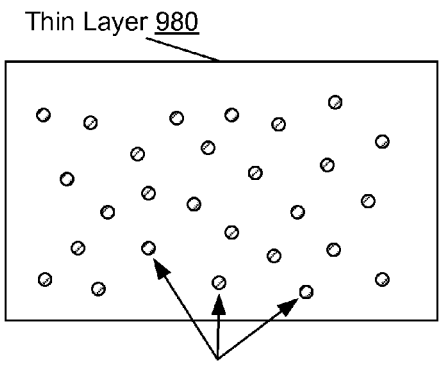
FIG. 10A illustrates a cross-section of an example of the thin photoactive layer.

While the thin sensitizing layer 980 may be solid, it may instead be porous, as illustrated in FIG. 10A. If porous, the sensitizing layer 980 includes a plurality of pathways 1001 (i.e., openings) through a unitary layer. The adjacent layers (e.g., the donor 152 and the acceptor 154) directly contact each other through the pathways 1001, providing charge carriers a direct path between layers. The pathways 1001 can manifest during the deposition process due to, for example, using such a thin layer 980 that there is a natural irregularity to coverage (e.g., growth until material nucleation sites connect, but before all gaps are filled), or by having surface irregularity in the underlying layer (e.g., donor 152) that results in irregular coverage.

Figure 10B:
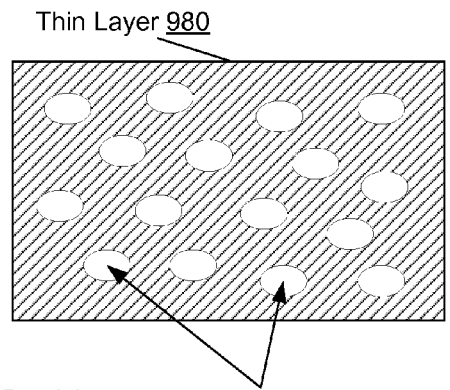
FIG. 10B illustrates a cross-section of another example of the thin protective layer.

FIG. 10B is another example of thin layer 980. In this example, the layer comprises a plurality of discontinuous islands of material. The islands 1002 can manifest during the deposition process due to, for example, stopping growth shortly after nucleation.

A solid layer, a discontinuous layer of islands, or a porous unitary layer may be selected during fabrication simply by controlling how long growth is allowed to continue after material nucleation. While all three styles of layer 980 are operable, the discontinuous layer of islands is preferred. More preferably, the islands each comprise a crystallite of the respective photoconductive material, each crystallite having no dimension greater than 100 nm (i.e., nanocrystals).

Among the advantages of nanocrystals is improved carrier mobility and lower series resistance in comparison to amorphous-phase islands. Moreover, a quasi-random arrangement of nanocrystals, including plural discontinuous layers of different photoconductive materials, enhances performance since the quasi-random distribution of crystals increases the occurrence of conductive pathways for collection of photogenerated charge carriers and further enhances the absorption of light due to the ability to form thicker devices. Preferably, the continuous donor layer 152 and the continuous acceptor layer 154 are also polycrystalline or monocrystalline.

Preferably, the thin sensitizing layer 980 is a small molecule material. Likewise, it is preferred at the donor layer 152 and acceptor layer 154 also be small molecule materials. However, while small molecules are preferred, polymers can also be used for one or more of the sensitizers, donor, and acceptor, depending on the deposition method as described further below.

To absorb NIR, the sensitizing material should preferably have an absorption coefficient of at least $5 \times 10^4$ cm$^{-1}$ across a wavelength band from 600 nm to 900 nm. To maximize coverage of the absorption spectra, the three photoactive layers (152, 980, 154) should preferably each have a different absorption spectra.

Figure 11:
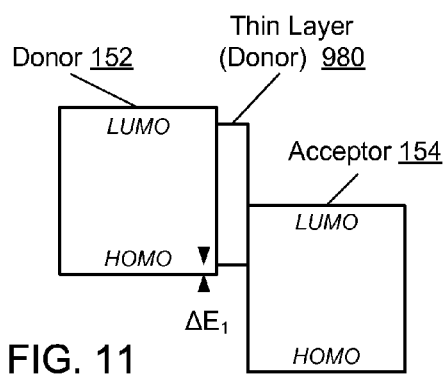
FIG. 11 illustrates an energy level diagram including the thin photoactive layer as a donor.

Referring to FIG. 11, the thin sensitizing layer 980 may serve as a donor, having a different host material than donor layer 152. Preferably for such an arrangement, the HOMO of the thin sensitizing layer 980 is no more than 5 kT above the HOMO of the donor layer 152 (k being the Boltzmann constant and T being the operating temperature), thereby avoiding the trapping of holes at the donor layer (152)-sensitizing layer (980) interface. This difference in HOMO levels is illustrated as $\Delta E_1$ in FIG. 11.

Operating temperatures for organic photosensitive devices are commonly specified as having a range of T=−40° C. to +100° C., with a nominal operating temperature approximated as +300° K. Using the nominal operating temperature and solving for 5 kT, the HOMO of the thin sensitizing layer 980 should preferably be no more than 0.13 eV above the HOMO of the donor layer 152 if serving as a donor.

If arranging the sensitizing layer 980 as a donor, the band gap of the material forming the sensitizing layer 980 is preferably less than the band gap of the material forming the donor layer 152. Since absorption sensitivity is, in general, inversely proportional to the band gap of a pure material, arranging the band gaps in this manner enables absorption of longer-wavelength photons than would occur with the donor layer 152 alone.

By keeping the sensitizing layer 980 thin, a whole class of materials that would otherwise not be viable with any reasonable efficiency in a photoactive device may be used. For example, if arranging sensitizing layer 980 as a donor, a host material having a hole mobility of less than $1 \times 10^{-9}$ cm$^2$/Vs can be used for the sensitizing layer 980. Classically, using such a material as a donor is counterintuitive, since high hole mobility is a characteristic sought for donors to maximize the external quantum efficiency of the device. However, there are many low hole-mobility materials, such as tin(II) phthalocyanine (SnPc) and lead phthalocyanine (PbPc) with poor hole mobilities, but with absorption coefficients of at least $5 \times 10^4$ cm$^{-1}$ across a wavelength band from 600 nm to 900 nm.

Moreover, as a result of the conductive pathways through each discontinuous layer in FIGS. 10A and 10B, the discontinuous sensitizer layers may be made of materials having most any bandgap, including bandgaps wider than the donor and/or acceptor. Unlike conventional small molecular weight or polymeric organic photovoltaic cells, where only conductive or semi-conductive materials are ordinarily allowed, the new photovoltaic cells may include non-conductive dyes such as the Ru-dyes used in dye-sensitized solar cells (DSSC). Such dyes have high absorption coefficient over a broad wavelength range, although they are indeed insulators.

For example, a CuPc donor and a $C_{60}$ acceptor can be paired with SnPc (absorbing longer wavelengths than CuPc and $C_{60}$) and Ru(acac)$_3$ (absorbing shorter wavelengths than CuPc and $C_{60}$).

Thus, materials with highly desirable absorption properties but poor mobility properties may be used in the sensitizing layer 980, even though such materials may not have previously been usable due to their poor mobility or carrier transport properties.

Figure 12:
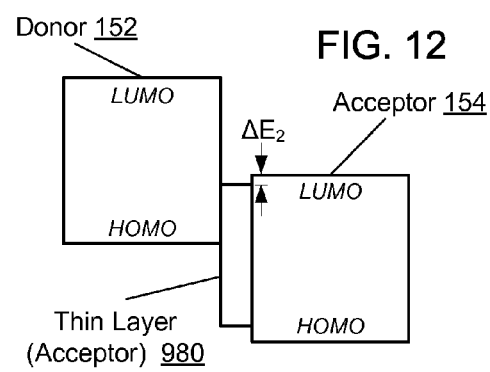
FIG. 12 illustrates an energy level diagram including the thin photoactive layer as an acceptor.

Referring to FIG. 12, the thin sensitizing layer 980 may serve as an acceptor, having a different host material than acceptor layer 154. Preferably, the LUMO of the thin sensitizing layer 980 is no more than 5 kT below the LUMO of the acceptor layer 154, thereby avoiding the trapping of electrons at the acceptor layer (154)-sensitizing layer (980) interface. This difference in LUMO levels is illustrated as $\Delta E_2$ in FIG. 12.

If arranging the sensitizing layer 980 as an acceptor, the band gap of the material forming the sensitizing layer 980 is preferably less than the band gap of the material forming the acceptor layer 154. Since absorption sensitivity is, in general, inversely proportional to the band gap of a pure material, arranging the band gaps in this manner enables absorption of longer-wavelength photons than would occur with the acceptor layer 154 alone.

By keeping the sensitizing layer 980 thin, a host material having an electron mobility of less than $1 \times 10^{-9}$ cm$^2$/V may used. Classically, using such a material as an acceptor is counterintuitive, since high electron mobility is a characteristic sought for acceptors to maximize the external quantum efficiency of the device. Thus, materials with highly desirable absorption properties but poor mobility properties may be used in the sensitizing layer 980, even though such materials may not have previously been usable due to their poor mobility properties.

The sensitizing layer 980 may also be used in a hybrid heterojunction, as illustrated in FIGS. 13 and 14. In FIG. 13, sensitizing layer 980 serves as a donor within photoactive region 1350. Preferably, as a donor, the HOMO of the thin sensitizing layer 980 is no more than 5 kT above the HOMO of the donor layer 152 ($\Delta E_1$). In FIG. 14, sensitizing layer 980 serves as a acceptor within photoactive region 1450. Preferably, as an acceptor, the LUMO of the thin sensitizing layer 980 is no more than 5 kT below the LUMO of the acceptor layer 154 ($\Delta E_2$).

FIG. 15 illustrates a photoactive region 1550 including a plurality of donor sensitizing layers (980a, 980b) and a plurality of acceptor sensitizing layers (980c, 980d). Preferably, each of the layers 980a-d is composed of a plurality of discontinuous islands as illustrated in FIG. 10B. More preferably, each of the islands is a nanocrystal.

FIG. 16 is an energy level diagram for a photosensitive cell comprising the plurality of thin sensitizing layers 980a-d within the single photoactive region in FIG. 15. Preferably, to avoid charge carrier trapping: the HOMO of the first thin sensitizing donor layer 980a is no more than 5 kT above the HOMO of the donor layer 152 ($\Delta E_{1,1}$); the HOMO of the second thin sensitizing donor layer 980b is no more than 5 kT above the HOMO of the first thin sensitizing donor layer 980a ($\Delta E_{1,2}$); the LUMO of the first thin sensitizing acceptor layer 980c is no more than 5 kT below the LUMO of the second thin sensitizing acceptor layer 980d ($\Delta E_{2,1}$); and the LUMO of the second thin sensitizing acceptor layer 980d is no more than 5 kT below the LUMO of the acceptor layer 154 ($\Delta E_{2,2}$).

While there is no limit on the number of different sensitizing materials that might be used in a single photoactive region, it is not thought to be worthwhile to use more than 10 or 11 different sensitizers, since further increase in the number of sensitizers would achieve diminishing returns in terms of broadening spectral coverage. Additionally, the complexity of growth and manufacturing increases with the increasing number of different materials.

Figure 17:
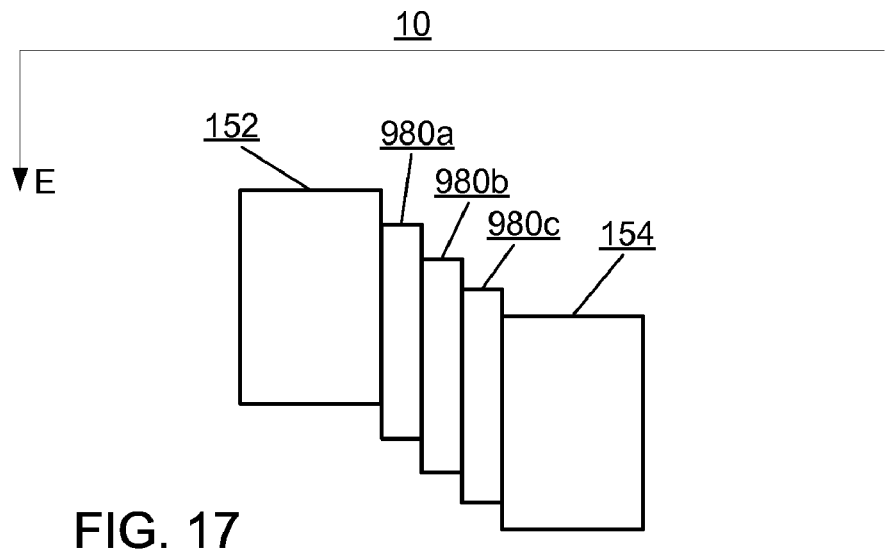
FIG. 17 illustrates an energy level diagram including a plurality of thin photoactive layers of sensitizer materials between a donor and an acceptor arranged to form an energy cascade.

As noted above, in addition to arranging the sensitizers as donors and acceptors complementing the continuous donor layer 152 and the continuous acceptor layer 154 (e.g., FIG. 16), the arrangement of sensitizers can be random. However, an alternative arrangement to the photoactive region in FIG. 16 is to arrange the sensitizers to form an energy cascade, creating a charge-separating built-in potential to spatially dissociate photogenerated excitons. For example, FIG. 17 illustrates an energy level diagram of a photoactive region 1850 including three sensitizers 980a-980c arranged between a continuous donor layer 152 and a continuous acceptor layer 154. For further discussion of spatial dissociation of photogenerated excitons using an energy cascade, see U.S. patent application Ser. No. 11/486,163 by B. Rand et al. filed Jul. 14, 2006 entitled "New Architectures and Criteria For the Design of High Efficiency Organic Photovoltaic Cells," incorporated herein by reference.

Figure 18:
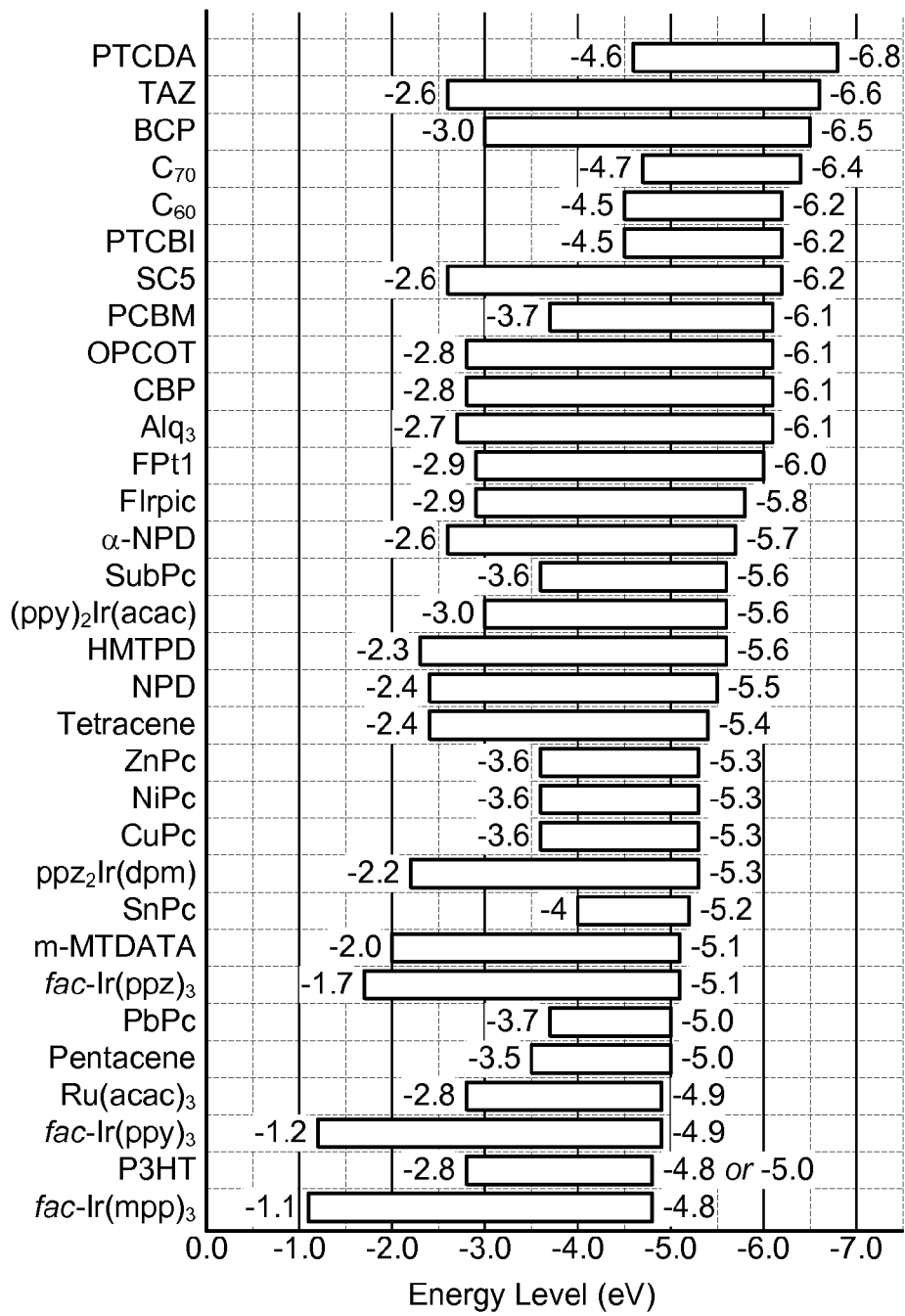
FIG. 18 demonstrates the relative HOMO and LUMO levels and energy gaps for a variety of organic photoconductive materials as non-exclusive examples of materials that can be used within the photoactive region of a hybrid planar-nanocrystalline bulk heterojunction as donors, acceptors, and sensitizers.

To demonstrate the practicality of designing the arrangement illustrated in FIG. 17, FIG. 18 illustrates the HOMOs and LUMOs for a variety of organic semiconductor materials. The figure is oriented sideways, with vacuum level (0 eV) on the left side. The full name of the listed materials are as follows:

PTCDA: 3,4,9,10-perylenetetracarboxylic dianhydride.
TAZ: 3-phenyl-4-(1'-naphthyl)-5-phenyl-1,2,4-triazole.
BCP: 2,9-dimethyl-4,7-diphenyl-1,10-phenanthroline.
$C_{60}$: $C_{60}$.
$C_{70}$: $C_{70}$.
PTCBI: 3,4,9,10-perylenetetracarboxylic bis-benzimidazole.
SC5: 1,3,5-tris-phenyl-2-(4-biphenyl)benzene.
PCBM: [6,6]-phenyl-C61 butyric acid methyl ester.
OPCOT: octaphenyl-cyclooctatetraene.
CBP: 4,4'-N,N-dicarbazole-biphenyl.
$Alq_3$: 8-tris-hydroxyquinoline aluminum.
FPt1: the following platinum(II)(2-4,6-difluorophenyl)pyridinato-N,$C^2$)β-diketonate:

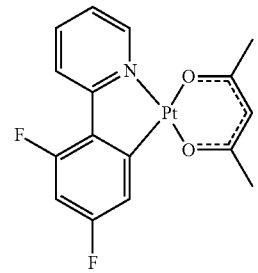

Flrpic: bis(2-(4,6-difluorophenyl)pyridyl-N,C2')iridium(III) picolinate.
α-NPD: 4,4'-bis[N-(1-napthyl)-Nphenyl-amino]biphenyl.
SubPc: Boron subphthalocyanine chloride.
$(ppy)_2Ir(acac)$: bis(2-phenylpyridine)iridium(III) acetylacetonate.
HMTPD: 4,4'-bis[N,N'-(3-tolyl)amino]-3,3'-dimethyl biphenyl.
NPD: N,N'-diphenyl-N—N'-di(1-naphthyl)-benzidine.
Tetracene: tetracene.
ZnPc: zinc phthalocyanine
NiPc: nickel phthalocyanine.
CuPc: copper phthalocyanine
$ppz_2Ir(dpm)$: Iridium(III) bis(1-phenylpyrazolato,N,C2')(2,2,6,6-tetramethyl-3,5-heptanedionato-O,O).
SnPc: tin phthalocyanine
m-MTDATA: 4,4',4"-tris(3-methylphenylphenylamino) triphenylamine.
$fac\text{-}Ir(ppz)_3$: facial tris(1-phenylpyrazolato,N,C2')iridium (III).
PbPc: lead phthalocyanine.
Pentacene: pentacene.
$Ru(acac)_3$: tris(acetylacetonato)ruthenium(III).
$fac\text{-}Ir(ppy)_3$: facial tris(2-phenylpyridine)iridium(III).
P3HT: poly(3-hexylthiophene).
$fac\text{-}Ir(mpp)_3$: facial tris(3-methyl-2-pheynlpyridine)iridium (III).

The invention is not limited to these materials, and data for many additional materials is readily available in the organic semiconductor literature. In addition, the material bandgaps, HOMOs and LUMOs for some molecules may be tunable by changing substituents.

As is known in the art, the error in measurement of HOMOs and LUMOs can be significant. For example, with current photoelectron spectroscopy and electrochemical measurement, variations in HOMOs can be as high +/−0.1 eV and in LUMOs can be as high as 0.2-0.5 eV, particularly when comparing tests from different labs. Testing accuracy is continually improving. Meanwhile, it is recommended that candidate materials for a cascade arrangement be selected from literature, and then the LUMOs and HOMOs of each of the candidate materials be measured under the same conditions on the same equipment to minimize experimental error.

The photoactive regions (950, 1350, 1450, 1550, 1850) having the one or more sensitizing layers 980 are interchangeable with photoactive regions 150 and/or 150' in the photosensitive devices discussed above, including devices 100, 400, and 500. Any pattern of discontinuous layers can be used for the respective photoactive regions of the tandem designs. Each photoactive region in the tandem device may be the same or different in terms of material pattern and choice of materials. A variety of other tandem arrangements can be utilized as known in the art, as described for example in U.S. Pat. No. 6,352,777 (incorporated above) where insulators are placed between the photoactive regions.

Although anode smoothing layer 122 is shown in the examples, the layer is entirely optional and there is no particular requirement for smoothing prior to depositing the first continuous layer of photoconductive material (donor 152 in the examples). A preferred construction is to omit the smoothing layer 122 and to deposit the first continuous layer of photoconductive material as a conformal layer over a rough bottom electrode material (such as $SnO_2$). For detailed discussion of conformal deposition over a rough electrode, see F. Yang et al., "Organic Solar Cells Using Transparent $SnO_2$—F Anodes," Advanced Materials Vol. 18, Issue 15, pp. 2018-2022 (2006), and U.S. patent application Ser. No. 11/483,642 by F. Yang et al. filed Jul. 11, 2006 and entitled "Organic Photosensitive Cells Grown On Rough Electrode With Nano-Scale Morphology Control," both of which are incorporated herein by reference.

Cost can be reduced by using rough materials for the electrodes/charge transfer layers because rough materials such as $SnO_2$ are less expensive than smoother transparent conductors (such as indium tin oxide). Moreover, by eliminating the smoothing layer 122, the surface area is increased within the photoactive region if a conformal first continuous layer of photoconductive material carries through the underlying surface roughness. Series resistance can be lowered if the conformal layer is made very thin and the smoothing layer is omitted. Preferably, the rough bottom electrode has an exposed surface with a root mean square roughness of at least 30 nm and a height variation of at least 200 nm. "Height variation" refers to the difference between the highest point and the lowest point on the surface of the rough material.

Any number of less-expensive transparent conductive oxides (TCOs) with high surface roughness are available. Examples of other less-expensive rough transparent conductive oxides include ZnO, and $SnO_2$. Preferably, the conductivity of the rough TCO is increased by doping, such as with aluminum-doped ZnO (ZnO:Al), antimony-doped $SnO_2$ ($SnO_2$:Sb), fluorine-doped ZnO (ZnO:F), and gallium-doped ZnO (ZnO:Ga). In addition, as an alternative to TCOs, a transparent rough transparent oxide with exceptional conductivity properties can be formed from carbon nanotubes in a small molecule or polymer matrix. If desired, more expensive rough TCOs may also be used, such as GaO and InGaO.

Figure 19:
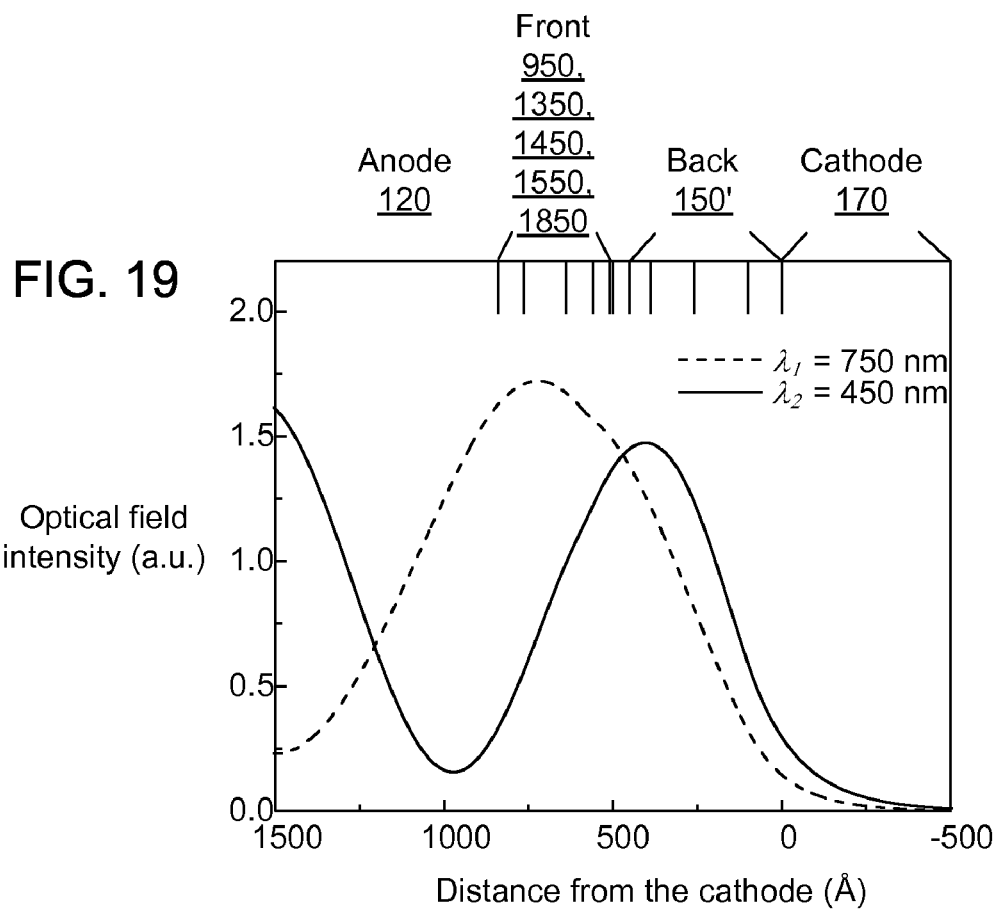
FIG. 19 illustrates the positioning of the various layers to maximize absorption by the thin photoactive layer.

As illustrated in FIG. 19, device performance is improved by positioning at least a portion of the thin sensitizing layer 980 (as illustrated, arranged as a layer within a photoactive region 950/1350/1450/1550/1850 in the tandem device shown in FIG. 7) at an optical path length of $\lambda_1 \cdot d + \lambda_1/4$ (d is an integer $\geq 0$) from a reflective surface of the device. If, for example, the sensitizing layer 980 has an absorption coefficient of at least $5 \times 10^4$ $cm^{-1}$ across a wavelength band from 600 nm to 900 nm, then $\lambda_1$ is a wavelength in the wavelength band from 600 nm to 900 nm. By positioning a peak in this band (750 nm, as illustrated) to overlap a portion of the sensitizing layer better assures that light in the desired bandwidth will be absorbed.

The reflective surface preferably reflects at least 50% of incident light at $\lambda_1$. The reflective surface can be a separate layer, or may be provided by one of the electrodes (e.g., cathode 170 in FIG. 2 and FIG. 7; anode 170' in FIG. 8).

If the sensitizing layer 980 is in a photoactive region of a first cell within a stack of cells, overall performance can be improved by configuring the different cells to have different absorption characteristics. Preferably, the average absorption of the first cell (having the sensitizing layer 980), is greater than the average absorption of the second cell over a range of wavelengths $\lambda_1 \pm 5\%$, and an average absorption of the second cell is greater than the average absorption of the first cell over a range of wavelengths $\lambda_2 \pm 5\%$; where $\lambda_1 \geq \lambda_2 + 10\%$, $\lambda_1$ is a wavelength in the absorption band from 600 nm to 900 nm, and the host material serving as the sensitizing layer 980 has an absorption coefficient of at least $5 \times 10^4$ $cm^{-1}$ across 600 nm to 900 nm.

Since what materials constitute a donor and what materials constitute an acceptor depend up relative energy levels between layers, a same material (e.g., SnPc, PbPc) may serve as a donor layer with one set of materials as donor 152/252 and acceptor 154/254, and serve as an acceptor layer with a different set of materials as donor 152/252 and acceptor 154/254.

Figure 21:
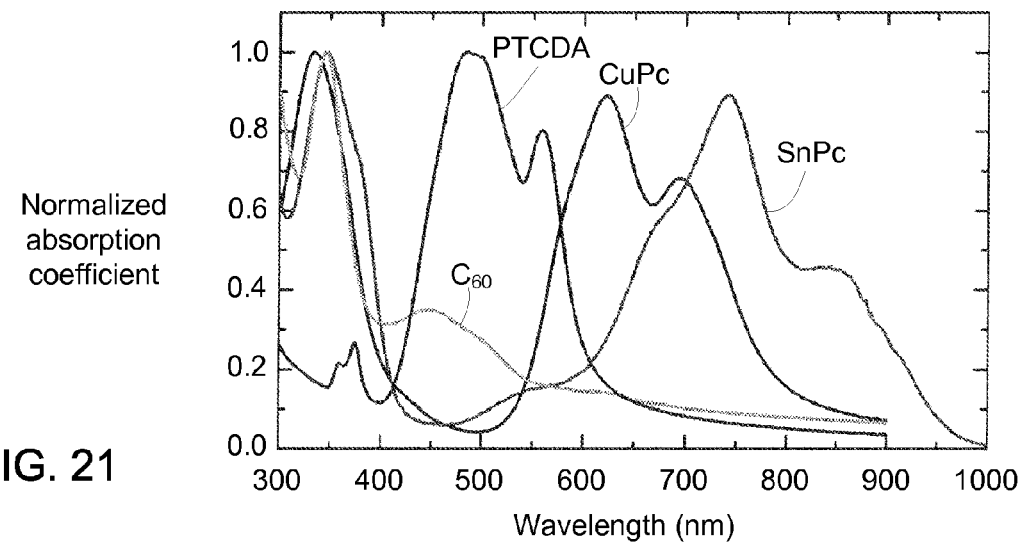
FIG. 21 illustrates the normalized absorption spectra for the materials in FIG. 20.
Figure 22:
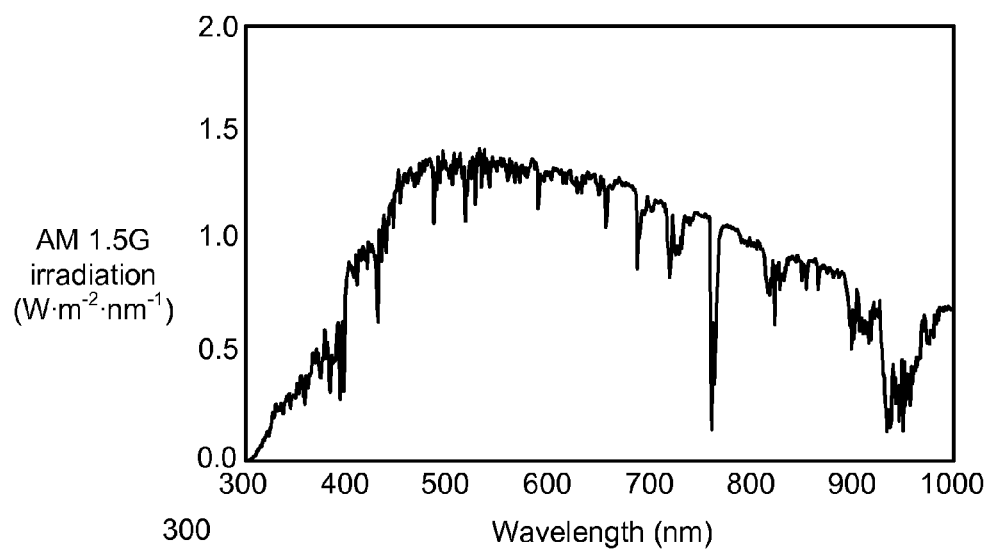
FIG. 22 is an AM 1.5 G radiation spectrum (for reference).

A preferred arrangement of four photoactive materials is illustrated in FIG. 20. The continuous donor layer 2052 consists essentially of CuPc, the first discontinuous layer 2080a consists essentially of SnPc, the second discontinuous layer 2080b consists essentially of $C_{60}$, and the continuous acceptor layer 2054 consists essentially of PTCDA. As illustrated in FIG. 21, this selection of materials provide improved absorption over the solar spectrum in comparison to a simple two material donor-acceptor arrangement. An AM 1.5 G solar irradiation spectrum is reproduced in FIG. 22 for reference.

To produce high-quality grain boundaries between materials, the nanocrystals are preferably grown in conditions that promote nucleation of the crystallites at the interface with the previously deposited photoconductive layers. Crystal growth in transit to the surface is inhibited (e.g., gas-phase nucleation within the carrier gas ambient is inhibited).

Any controlled-growth technique able to grow organic molecular crystals on-site (at the deposition surface) can be used to make the discontinuous layers. The controlled-growth techniques that are contemplated for growth of the nanocrystals include organic vapor phase deposition (OVPD), organic vapor jet deposition (OVJD; also known as organic vapor jet printing), vacuum thermal evaporation (VTE), organic molecular beam deposition (OMBD), molecular self-assembly from solutions or liquid crystals, and annealing of amorphous polymer films.

If a plurality of discontinuous layers of nanocrystallite islands are grown from different photoconductive materials, the large number of different material interfaces promotes the occurrence of conductive pathways. However, depending upon relative molecular orbital energy levels between materials, there may be some electrically isolated sensitizer islands that will increase the device serial resistance and not contribute to improved efficiency.

In addition to employing controlled surface growth and keeping the discontinuous layers thin to promote lateral separation between crystallites, supplemental deposition techniques can be used to minimize the occurrence of isolated islands of materials that do not connect to an electrically conductive pathway for their respective charge carriers. These techniques include selecting the order of material growth to promote formation of conductive pathways, controlling the concentration/density of islands, selective deposition (e.g., using a shadow mask placed close to the substrate; targeted pulsing, angling and/or positioning the molecular beam or nozzles), and tilting the substrate between layers to provide a degree of control that can help minimize the occurrence of islands. Selectivity may also include changing the position of the substrate relative to the gas flow (OVJD, OVPD) during the deposition process.

As growth methods for the continuous layers, most any method can be used, including OVJD, OVPD, VTE, OMBD, solution processing, and ink jet printing. As noted above, the continuous layers are preferably polycrystalline or monocrystalline.

As growth methods for the discontinuous layers, OVJD and OVPD can be used for the deposition of small molecule materials, monomers, oligomers, and dendrimers. Since OVJD and OVPD heat the molecular source, these processes are generally unsuitable for use with polymers that thermally decompose when heated. VTE and OMBD are generally suitable for use with most any organic molecule, including thermally-sensitive polymers. In general, OVJD and OVPD are preferred for growth of the discontinuous layers, since VTE provides less precise control over film-thickness, and since OMBD can be prohibitively expensive.

OVPD is inherently different from the widely used VTE in that OVPD uses a carrier gas to transport vapors into a deposition chamber. Spatially separating the functions of evaporation and transport leads to precise control over the deposition process, and enabling control over the organic surface morphology. Another feature of OVPD, compared with VTE, is the large molecular surface diffusivity and the non-ballistic trajectories followed by the molecules in their arrival at the surface. The short mean free path of OVPD makes it particularly effective at filling preexisting voids and other surface non-uniformities, whereas VTE is ineffective due to the long mean free paths and ballistic trajectories followed by incident molecules.

At typical deposition conditions used in OVPD, the flow of the carrier gas around the substrate creates a hydrodynamic boundary layer where molecular transport is diffusion-limited. The deposition rate, deposition efficiency, and film morphology are controlled by adjusting the organic species concentration, flow hydrodynamics, and surface diffusivity.

OVJD is similar to OVPD (e.g., hot-walled chamber, carrier gas delivery, similar pressures) and both delivery methods can be performed in a same chamber. In general, OVJD provides the highest degree of control. Whereas molecules have fairly random vectors in OVPD, OVJD delivers collimated jets of organic vapor and carrier gas (similar to the directional nature of OMBD, but having a hydrodynamic flow at the deposition surface). For a background discussion of OVJD, see U.S. Patent Application Publication 2004/0048000A1 by Shtein, entitled "Device and Method For Organic Vapor Jet Deposition," incorporated herein by reference. For examples of selective deposition by OVPD and OVJD, see U.S. patent application Ser. No. 11/483,641 by F. Yang et al. filed Jul. 11, 2006 and entitled "Organic Photosensitive Cells Grown On Rough Electrode with Nano-Scale Morphology Control", which is incorporated herein by reference.

Another consideration when choosing the deposition method for the discontinuous layers is the desire to avoid unfilled voids in the finished device. While VTE and OMBD may be used to form the discontinuous layers, a shortcoming of both VTE and OMBD is the poor ability to fill pockets and voids in underlying layers. However, the carrier-gas flow dynamics of both OVPD and OVJD are able to provide excellent coating and coverage of such pockets.

In general, OVPD is less selective than OVJD and is better at filling voids. However, the flow dynamics of OVJD can be modified to promote void filling by inter alia lowering the pressure in the deposition chamber, lowering flow rate of the carrier gas, moving the target away from the nozzles, and increasing the surface temperature of the target. While locally, this makes an OVJD deposition less selective, a high degree of overall selectivity can be retained by controlling over which areas of the target the nozzles are activated.

With each of these methods, the preferred technique for forming nanocrystals is to stop growth shortly after nucleation, as referred to above in the discussion of FIG. 10B.

If forming a discontinuous layer by annealing of an amorphous polymer film, islands of amorphous film can be deposited by, for example, jet-based or mask-based printing techniques and then thermally annealed to create crystals. This technique can also be used with spin-coated films to form continuous layers consisting of a mixture of polymer crystals in an uncrystallized amorphous matrix (shorter anneal) or a monocrystalline polymer layer (longer anneal). For a background discussion of the deposition and morphology of polymer annealed films, see (for example) P. Vanlaeke et al., "P3HT/PCBM bulk heterojunction solar cells: Relation between morphology and electro-optical characteristics," Solar Energy Materials & Solar Cells 90, 2150-2158 (2006), incorporated herein by reference.

Self-assembly techniques can also be use to form the discontinuous islands. For a background discussion of the formation of discrete nanostructures by self-assembly, see (for example) Yong-Sik Yoo et al., "3-D Organic nanostructures from self-assembly of branched aromatic rods," J. Mater. Chem. 15, 419-423 (2005), incorporated herein by reference. Jet-based or mask-based printing techniques can also be used to further enhance the degree of control over material placement if using self-assembly techniques.

Figure 23A:
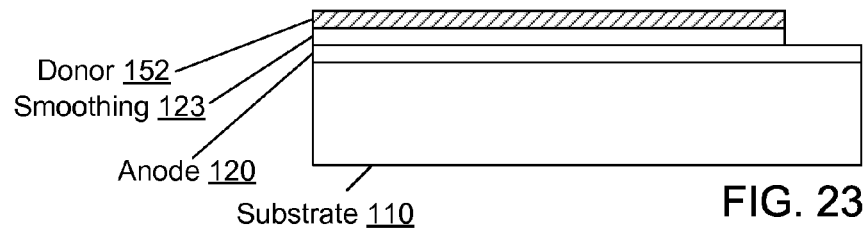
FIGS. 23A-23G illustrate steps for forming an example device including nanocrystal sensitizer layers.
Figure 23B:
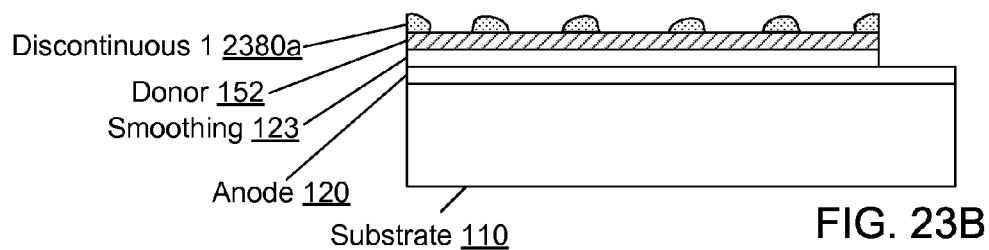
Figure 23C:
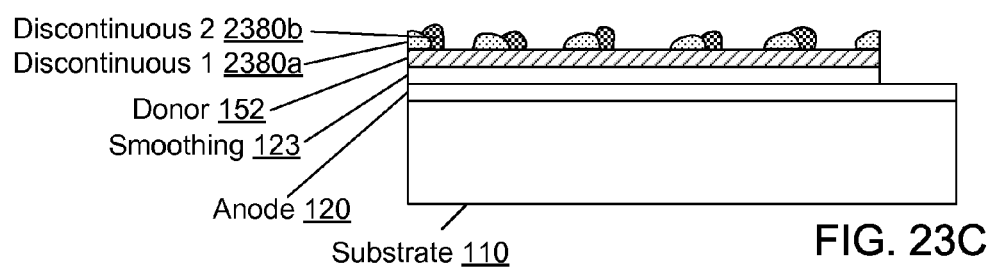
Figure 23D:
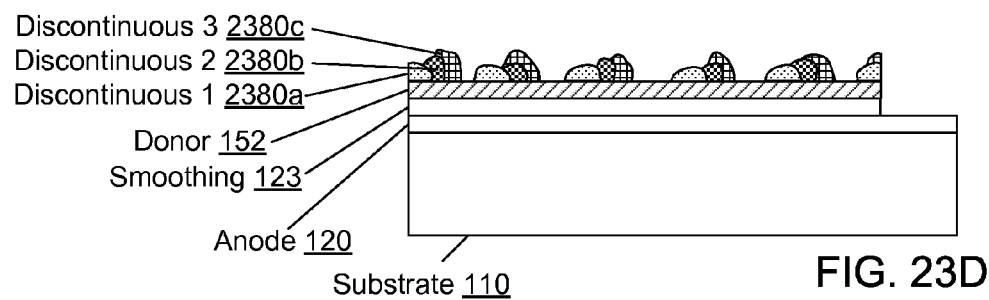
Figure 23E:
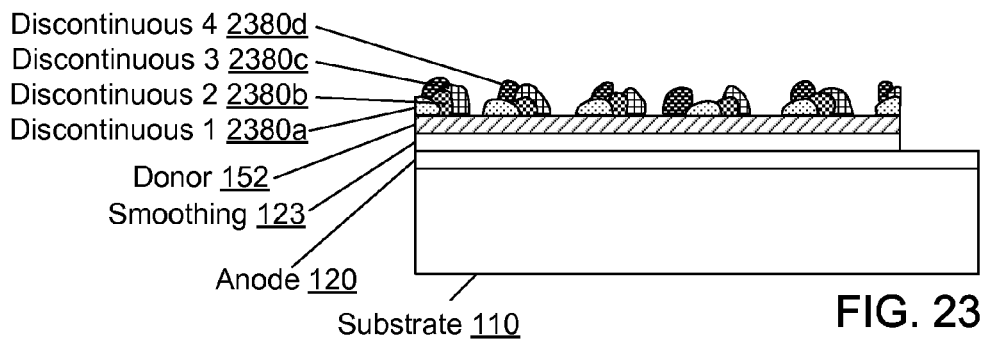
Figure 23F:
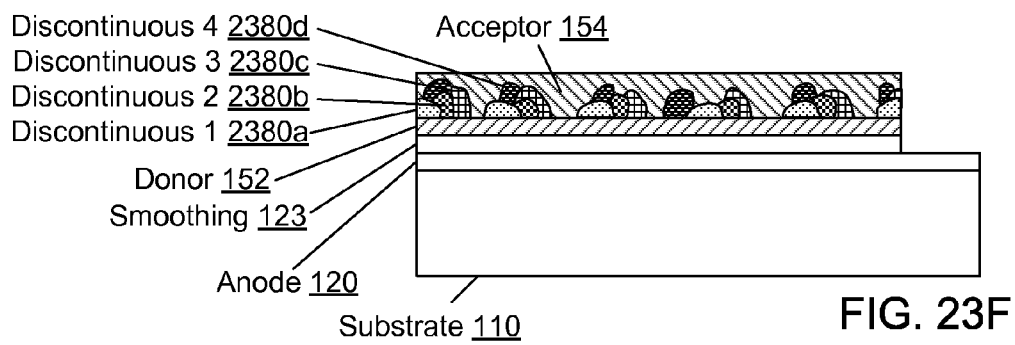
Figure 23G:
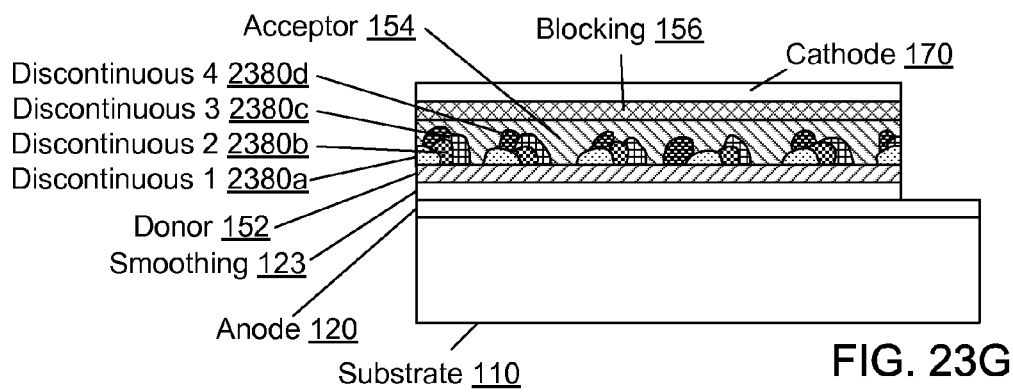
Figure 24:
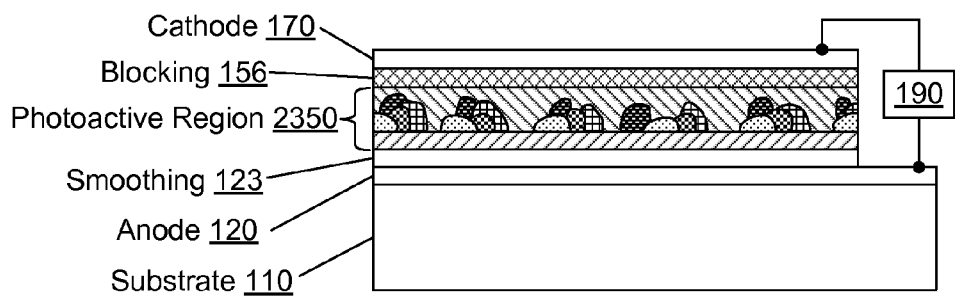
FIG. 24 illustrates a circuit utilizing the device formed by the method in FIGS. 23A-23G.

FIGS. 23A through 23G illustrate processes steps demonstrating deposition of nanocrystals of four different sensitizer materials between a continuous donor layer and a continuous acceptor layer. A continuous donor layer 152 is deposited in FIG. 23A prior to growth of the nanocrystalline discontinuous layers. In FIG. 23B, plural nanocrystals are deposited as a first discontinuous layer 2380*a*. In FIG. 23C, plural nanocrystals are deposited as a second discontinuous layer 2380*b*. In FIG. 23D, plural nanocrystals are deposited as a third discontinuous layer 2380*c* In FIG. 23E, plural nanocrystals are deposited as a fourth discontinuous layer 2380*d*. In FIG. 23F, a continuous acceptor layer 154 is deposited. In FIG. 23G, an exciton blocking layer 156 and cathode 170 are deposited. FIG. 24 illustrates the finished device arranged in a circuit.

As described above, the photoconductive materials selected for discontinuous layers 2380*a* through 2380*d* are preferably selected to broaden the absorption spectra of the photoactive region 2350 beyond that provided by the donor and acceptor materials alone.

Although the example structures show a conventional orientation having an anode on the bottom, reverse structures having a cathode on the bottom can also be built. The exciton blocking layer 156 may be omitted, and/or an exciton blocking layer can be included between the donor 152 and the anode 120.

As described above, organic photosensitive devices of the present invention may be used to generate electrical power from incident electromagnetic radiation (e.g., photovoltaic devices) or may be used to detect incident electromagnetic radiation (e.g., a photodetector or photoconductor cell).

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A photosensitive device comprising:
a first electrode and a second electrode;
a plurality of organic photoconductive materials disposed in a stack between the first electrode and the second electrode said stack comprising:
a first continuous layer of a donor host material;
a second continuous layer of an acceptor host material; and
at least one other organic photoconductive material disposed as a plurality of discontinuous islands between the first continuous layer and the second continuous layer, each of said at least one other photoconductive material having an absorption spectra different from the donor host material and the acceptor host material.

2. The photosensitive device of claim 1, wherein each of the discontinuous islands consists essentially of a crystallite of the respective organic photoconductive material.

3. The photosensitive device of claim 2, wherein each of the discontinuous islands has no dimension greater than 100 nm.

4. The photosensitive device of claim 3, wherein a distance from any point within each of the islands to a boundary of the island is not more than one exciton diffusion length of the respective organic photoconductive material for a majority of the islands of each organic photoconductive material.

5. The photosensitive device of claim 2, wherein the first continuous layer is in direct contact with the second continuous layer in-between the islands of said at least one other organic photoconductive material.

6. The photosensitive device of claim 2, wherein a first organic photoconductive material of said at least one other organic photoconductive material is a small molecule.

7. The photosensitive device of claim 6, wherein the donor host material and the acceptor host material are small molecules.

8. The photosensitive device of claim 2, wherein a band gap of a first organic photoconductive material of said at least one other organic photoconductive material is less than a band gap of the donor host material and less than a band gap of the acceptor host material.

9. The photosensitive device of claim 2, wherein a band gap of a first organic photoconductive material of said at least one other organic photoconductive material is greater than a band gap of the donor host material and greater than a band gap of the acceptor host material.

10. The photosensitive device of claim 2, wherein a band gap of a first organic photoconductive material of said at least one other organic photoconductive material is in between a band gap of the donor host material and a band gap of the acceptor host material.

11. The photosensitive device of claim 2, wherein a first organic photoconductive material of said at least one other organic photoconductive material has a hole mobility of less than $1\times10^{-9}$ cm$^2$/Vs and an absorption coefficient of at least $5\times10^4$ cm$^{-1}$ across a wavelength band from 600 nm to 900 nm.

12. The photosensitive device of claim 2, wherein a first organic photoconductive material of said at least one other organic photoconductive material is selected from tin (II) phthalocyanine (SnPc) and lead phthalocyanine (PbPc).

13. The photosensitive device of claim 12, wherein the acceptor host material is $C_{60}$.

14. The photosensitive device of claim 2, wherein a first organic photoconductive material of said at least one other organic photoconductive material has an absorption coefficient of at least $5\times10^4$ cm$^{-1}$ across a wavelength band from 600 nm to 900 nm.

15. The photosensitive device of claim 14, further comprising a reflective surface, wherein at least a portion of the islands of the first organic photoconductive material are disposed at an optical path length of $\lambda_1 \cdot d + \lambda_1/4$ from the reflective surface of the device, where:
$\lambda_1$ is a wavelength in the wavelength band from 600 nm to 900 nm,
d is an integer $\geq 0$, and
the reflective surface is reflective to at least 50% of incident light at $\lambda_1$.

16. The photosensitive device of claim 15, wherein the reflective surface is provided by one of the first electrode, the second electrode, and a reflector.

17. The photosensitive device of claim 15, the plurality of organic photoconductive materials being part of a first cell in a stack of photoactive cells disposed between the first electrode and the second electrode, the device further comprising a second cell of the stack of photoactive cells, the second cell comprising at least one donor-acceptor heterojunction, wherein the first cell and the second cell have different absorption characteristics, an average absorption of the first cell being greater than the average absorption of the second cell over a range of wavelengths $\lambda_1 \pm 5\%$, and an average absorption of the second cell being greater than the average absorption of the first cell over a range of wavelengths $\lambda_2 \pm 5\%$, where $\lambda_1 \geq \lambda_2 + 10\%$.

18. The photosensitive device of claim 2, wherein the plurality of discontinuous islands include islands of a first photoconductive material of said at least one other photoconductive material and islands of a second photoconductive material of said at least one other photoconductive material, the first photoconductive material having an absorption spectra different from the second photoconductive material.

19. The photosensitive device of claim 18, wherein a distance from any point within each island of the first photoconductive material to a boundary of the island is not more than one exciton diffusion length of the first organic photoconductive material for a majority of the islands of the first organic photoconductive material, and a distance from any point within each island of the second photoconductive material to a boundary of the island is not more than one exciton diffusion length of the second organic photoconductive material for a majority of the islands of the second organic photoconductive material.

20. A method of fabricating a photosensitive optoelectronic device, comprising:
depositing a first organic photoconductive material over a first electrode to form a first continuous layer;
depositing a second organic photoconductive material over the first continuous layer to form a first discontinuous layer comprising a plurality of islands;
depositing a third organic photoconductive material over the first discontinuous layer to form a second continuous layer; and
depositing a second electrode over the second continuous layer, wherein one of the first organic photoconductive material and the second organic photoconductive material consists essentially of a donor host material, and another of the first organic photoconductive material and the second organic photoconductive material consists essentially of an acceptor host material, and the second organic photoconductive material is a sensitizer having an absorption spectra different from the donor host material and the acceptor host material.

21. The method of claim 20, wherein each island consists essentially of a crystallite of the second organic photoconductive material.

22. The method of claim 21, wherein during the depositing of the second organic photoconductive material, each area of material growth contributes no more than 100 nm of growth in any dimension.

23. The method of claim 22, wherein a distance from any point within each of the islands to a boundary of the island is not more than one exciton diffusion length of the second organic photoconductive material for a majority of the islands of the second organic photoconductive material.

24. The method of claim 21, wherein a thickness of the first discontinuous layer is not greater than 200 Å.

25. The method of claim 24, wherein a thickness of the first discontinuous layer is not greater than 100 Å.

26. The method of claim 21, further comprising depositing a fourth organic photoconductive material, after depositing the first discontinuous layer but before depositing the second continuous layer, to form a second discontinuous layer comprising a plurality of islands, each island consisting essentially of a crystallite of the fourth organic photoconductive material, wherein during the depositing of the fourth organic photoconductive material, each area of material growth contributes no more than 100 nm of growth in any dimension, and wherein the fourth organic photoconductive material is a sensitizer having an absorption spectra different from the donor host material, the acceptor host material, and the second organic photoconductive material.

27. The method of claim 26, wherein the first, second, third, and fourth organic photoconductive materials are small molecule materials.

28. The method of claim 26, further comprising sequentially depositing additional organic photoconductive materials, after depositing the fourth organic photoconductive material but before depositing the second continuous layer, to form additional discontinuous layers comprising islands, each island consisting essentially of a crystallite of the respective organic photoconductive material, wherein during the depositing of each additional organic photoconductive material, each area of material growth contributes no more than 100 nm of growth in any dimension, wherein each additional organic photoconductive material is a sensitizer having an absorption spectra different from the donor host material, the acceptor host material, and the other sensitizers, including the second and fourth organic photoconductive materials, and wherein not more than 11 different sensitizers are deposited between the first continuous layer and the second continuous layer.

29. The method of claim 21, wherein a band gap of the second organic photoconductive material is less than a band gap of the donor host material and less than a band gap of the acceptor host material.

30. The method of claim 21, wherein a band gap of the second organic photoconductive material is greater than a band gap of the donor host material and greater than a band gap of the acceptor host material.

31. The method of claim 21, wherein a band gap of the second organic photoconductive material is in between a band gap of the donor host material and a band gap of the acceptor host material.

* * * * *